United States Patent
Sasaki

(10) Patent No.: US 9,762,117 B2
(45) Date of Patent: Sep. 12, 2017

(54) CONTROL DEVICE FOR POWER CONVERSION APPARATUS AND POWER CONVERSION APPARATUS

(71) Applicant: FUJI ELECTRIC CO., LTD., Kawasaki-shi, Kanagawa (JP)

(72) Inventor: Masahiro Sasaki, Azumino (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/199,881

(22) Filed: Jun. 30, 2016

(65) Prior Publication Data

US 2017/0054371 A1 Feb. 23, 2017

(30) Foreign Application Priority Data

Aug. 19, 2015 (JP) .................................. 2015-161847

(51) Int. Cl.
| | |
|---|---|
| *H02M 1/088* | (2006.01) |
| *H02M 1/32* | (2007.01) |
| *H02M 1/00* | (2006.01) |
| *H03K 17/18* | (2006.01) |

(52) U.S. Cl.
CPC ............. *H02M 1/32* (2013.01); *H02M 1/088* (2013.01); *H02M 2001/0009* (2013.01); *H03K 17/18* (2013.01)

(58) Field of Classification Search
CPC ................... H02M 1/088; H02M 1/32; H02M 2001/0009; H03K 17/18
See application file for complete search history.

(56) References Cited

U.S. PATENT DOCUMENTS

| 8,644,038 B2 * | 2/2014 | Sasaki | G01R 19/0092 |
| | | | 361/93.2 |
| 9,356,580 B2 * | 5/2016 | Mori | H02M 1/088 |
| 9,461,464 B2 * | 10/2016 | Asako | H02H 9/02 |
| 9,476,916 B2 * | 10/2016 | Minagawa | H02M 1/08 |
| 9,608,609 B2 * | 3/2017 | Wasekura | H03K 5/08 |
| 2004/0201935 A1 | 10/2004 | Yamamoto | |
| 2008/0304197 A1 | 12/2008 | Higashi | |

FOREIGN PATENT DOCUMENTS

| JP | 2004-312924 A | 11/2004 |
| JP | 2008-306807 A | 12/2008 |
| JP | 2014-230307 A | 12/2014 |

OTHER PUBLICATIONS

Rodrigo Alvarez et al., "A new delay time compensation principle for parallel connected IGBTs", 978-1-4577-0542-7 IEEE, p. 3000-3007, Sep. 2011.

* cited by examiner

*Primary Examiner* — Patrick O'Neill
(74) *Attorney, Agent, or Firm* — Rabin & Berdo, P.C.

(57) ABSTRACT

A sense voltage obtained by feeding a sense current of an IGBT into a sense resistor is input to a comparator, and as the reference voltage of the comparator, a sense voltage immediately before the IGBT is turned off is held by a sample and hold circuit for each switching, and is then divided by a voltage dividing circuit and the divided voltage is input to the comparator. The comparator compares the sense voltage with the voltage based on the sense voltage immediately before the IGBT is turned off, and therefore the comparator may accurately detect the falling edge time of the sense voltage and is used for the control for dissolving the imbalance in current with respect to the other IGBTs connected in parallel.

13 Claims, 13 Drawing Sheets

CONTROL DEVICE FOR POWER CONVERSION APPARATUS AND POWER CONVERSION APPARATUS

CROSS-REFERENCE TO RELATED APPLICATION

This application is based upon and claims the benefit of priority of the prior Japanese Patent Application No. 2015-161847, filed on Aug. 19, 2015, the entire contents of which are incorporated herein by reference.

BACKGROUND OF THE INVENTION

1. Field of the Invention

The embodiments discussed herein relate to a control device for a power conversion apparatus, the control device including a timing detection circuit which is needed to mutually correct an imbalance in current in a case where a plurality of power semiconductor elements is connected in parallel to constitute the power conversion apparatus, and to the power conversion apparatus including the power semiconductor elements therein.

2. Background of the Related Art

In power conversion apparatuses, power conversion is performed by switching and driving a power semiconductor element. In the power semiconductor element, the maximum current which one power semiconductor element is capable of feeding is limited in terms of physical properties and technically, and therefore when a load current exceeding this limit is needed, a plurality of power semiconductor elements is connected in parallel to increase the current capacity.

FIG. 9 illustrates a switching circuit formed by connecting two power semiconductor elements in parallel, FIG. 10 illustrates changes in current when two power semiconductors are switched, FIG. 11 illustrates an example of a timing detection circuit, and FIG. 12 is an explanatory view of the operation of the timing detection circuit.

In FIG. 9, an IGBT (Insulated Gate Bipolar Transistor) is illustrated as the power semiconductor element. This switching circuit is constituted by connecting the collectors of an IGBT 101 and an IGBT 102 and connecting the emitters thereof, and may constitute a high-side arm portion and a low-side arm portion in, for example, a totem pole output circuit of a power conversion apparatus.

The IGBTs 101 and 102 connected in parallel in this manner are turned on or turned off by simultaneous application of a pulse-like gate voltage to the gates thereof, respectively. At this time, when the current flowing into the collectors is designated as Ic, a current Ic1 flows into the IGBT 101 and a current Ic2 flows into the IGBT 102. Ideally, the current Ic is evenly distributed between the IGBTs 101 and 102 so as to satisfy Ic1=Ic2=Ic/2. However, in the transitional period of this switching operation, an imbalance may occur between the currents flowing into the IGBTs 101 and 102, respectively.

Such current imbalance is due to an individual difference in the element characteristics of the IGBT 101, 102, and/or due to a difference in the electrical characteristics in a gate wiring circuit.

Due to the above-described factors, if a difference (time difference) between the IGBTs 101 and 102 in the turn-on time and/or in the turn-off time occurs, a transitional current imbalance will occur between the IGBTs 101 and 102. For example, as illustrated in FIG. 10, assume that current first started to flow through the IGBT 101 and a little later current started to flow through the IGBT 102. In this case, at the turn-on time, the current flows only through the IGBT 101 and therefore in the period of a time delay difference Δtd, the current will concentrate on the IGBT 101 and a high current will flow therethrough. If the current concentration occurs, then the current exceeding the maximum rating flows, though for a short time, so that the IGBT 101 might be destroyed or the element temperature might abruptly rise to significantly degrade the element characteristics.

Therefore, it is proposed to reduce the current imbalance among a plurality of the IGBTs connected in parallel (e.g., see Japanese Laid-open Patent Publication No. 2014-230307). In this Japanese Laid-open Patent Publication No. 2014-230307, the turn-on and turn-off times of each IGBT are detected, and the turn-on and turn-off times of an IGBT which is turned on earlier are controlled so that the time delay difference Δtd becomes zero, i.e., so that the latter times are delayed. In this control, a variable gate resistor circuit is provided in a circuit which drives the gate of the IGBT and the resistance value of the variable gate resistor circuit is varied in accordance with the time delay difference Δtd. Thus, a plurality of IGBTs which is connected in parallel and is simultaneously driven is capable of reducing the current imbalance among the IGBTs.

The turn-on and turn-off times of the IGBT may be detected by a timing detection circuit illustrated in FIG. 11. The timing detection circuit of FIG. 11 detects the turn-on and turn-off times of the IGBT 101, for example, but also in the other IGBT 102, the turn-on and turn-off times are detected by a timing detection circuit having the same configuration.

This timing detection circuit includes a sense resistor Rs, a comparator 103, and a reference voltage source Vref. The IGBT 101 has a current sensing terminal that is formed by partially separating and partitioning the emitter region of the chip of the IGBT 101. A current corresponding to the area ratio between the current sensing terminal and the main emitter terminal will flow into this current sensing terminal as a sense current Is. This sense current Is flows to the ground through the sense resistor Rs connected to the current sensing terminal of the IGBT 101, so that a sense voltage Vs proportional to the emitter current is generated between the both ends of the sense resistor Rs. This sense voltage Vs is compared with a reference voltage source Vref in the comparator 103 and a signal Ipulse is output.

In the case where a reference voltage Vref is connected to the inverting input of the comparator 103 and the sense voltage Vs is connected to the noninverting input as illustrated in FIG. 11, this signal Ipulse rises when the sense voltage Vs exceeds the reference voltage source Vref and falls when the sense voltage Vs falls below the reference voltage source Vref as illustrated in FIG. 12. The rising of this signal Ipulse becomes the turn-on time of the IGBT 101, and the falling of the signal Ipulse becomes the turn-off time of the IGBT 101. Moreover, in the case where the reference voltage Vref is connected to the noninverting input of the comparator 103 and the sense voltage Vs is connected to the inverting input, this signal Ipulse falls when the sense voltage Vs exceeds the reference voltage source Vref and rises when the sense voltage Vs falls below the reference voltage source Vref. The falling of this signal Ipulse becomes the turn-on time of the IGBT 101, and the rising of the signal Ipulse becomes the turn-off time of the IGBT 101. The turn-on time is sent to a non-illustrated control circuit, where it is compared with the turn-on time of the IGBT 102, and the resistance value of the variable gate resistor circuit is controlled so that these turn-on times match.

Accordingly, the turn-on and turn-off times of the IGBTs 101 and 102 connected in parallel will be aligned to reduce the current imbalance between the IGBTs 101 and 102.

The above-described timing detection circuit detects the turn-on time and turn-off time of the IGBT by comparing the sense voltage Vs with the reference voltage source Vref. Here, in the case where the power semiconductor element is an IGBT, there is a problem that the turn-off of the IGBT is detected at a different time due to the current value of the collector current which had been flowing before the IGBT is turned off.

FIG. 13 illustrates a tail current that flows after an IGBT is turned off.

In an IGBT, due to turn-off, a collector current Ic sharply decreases and a tail current continues to flow immediately before the collector current becomes zero. That is, the shutoff of the collector current is performed by shorting or reverse-biasing between the gate and emitter of the IGBT, but at this time, the gate electric charge is discharged, the channel disappears, the supply of the base current is stopped, and then the IGBT starts to transition to a turn-off state. In this case, because there are a large amount of excess electrons and holes in an n− region as the accumulated charges, the collector current will not be immediately shut off but a tail current will flow. This tail current decreases gradually with a time constant that depends on the life time of the charges. Therefore, the larger the collector current Ic during turn-on, the longer the tail current continues to flow.

Accordingly, the turn-off time detected by the comparator 103 will significantly vary with the magnitude of the collector current Ic during turn-on. Here, in FIG. 13, a case will be described where the reference voltage source Vref is set equal to a voltage that corresponds to the sense voltage Vs when the collector current Ic of 5 A flows. When the collector current Ic is 10 A, the turn-off time by the timing detection circuit is 1.23 microseconds (μsec) after the measurement started, while when the collector current Ic is 150 A, the turn-off time by the timing detection circuit is 1.45 microseconds (μsec) after the measurement started. Therefore, upon receipt of a signal indicative of the turn-off time from the timing detection circuit, a non-illustrated control circuit performs control to reduce a current imbalance, based on a signal which varies with the magnitude of the collector current Ic. As described above, once an error occurs in which the turn-off time varies with the magnitude of the collector current Ic during turn-on, then even if the time delay difference Δtd is controlled so as to become zero, it will not actually become zero. As the result, the accuracy of the control to reduce the current imbalance will significantly decrease.

SUMMARY OF THE INVENTION

According to one aspect of the embodiments, there is provided a control device for a power conversion apparatus. The control device includes: gate drive circuits which simultaneously turn on or off a plurality of power semiconductor elements connected in parallel, respectively; timing detection comparators each configured to compare a sense voltage detected as a voltage proportional to a main current that flows when a corresponding one of the plurality of power semiconductor elements is turned on, with a reference voltage to detect turn-on and turn-off times of the corresponding power semiconductor element; and sample and hold circuits each configured to hold the sense voltage when the power semiconductor element is turned on, divide the sense voltage being held when the corresponding power semiconductor element is turned off, and supply a resulting divided voltage as the reference voltage for detecting the turn-off times of the corresponding power semiconductor element to a corresponding one of the timing detection comparators.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, embodiments disclosed herein will be described in detail with reference to the accompanying drawings. Note that, in the following description, the same reference sign may be used for the name of a terminal, and the voltage, signal, and the like at this terminal. Moreover, each embodiment may be implemented as a combination of a plurality of embodiments as long as it does not cause any contradiction.

Figure 1:
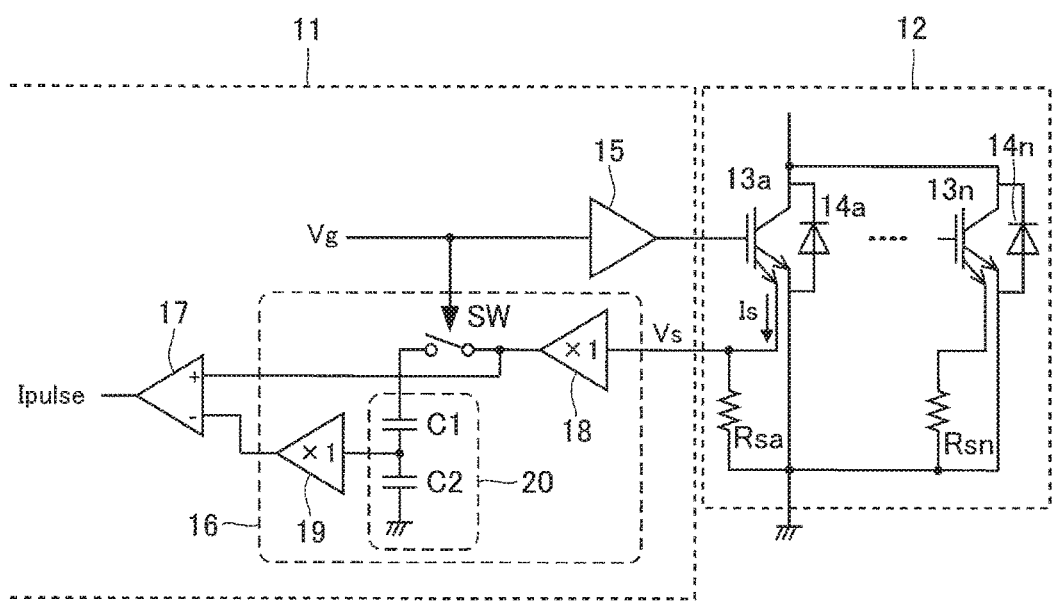
FIG. 1 illustrates a power conversion apparatus according to a first embodiment.
Figure 2:
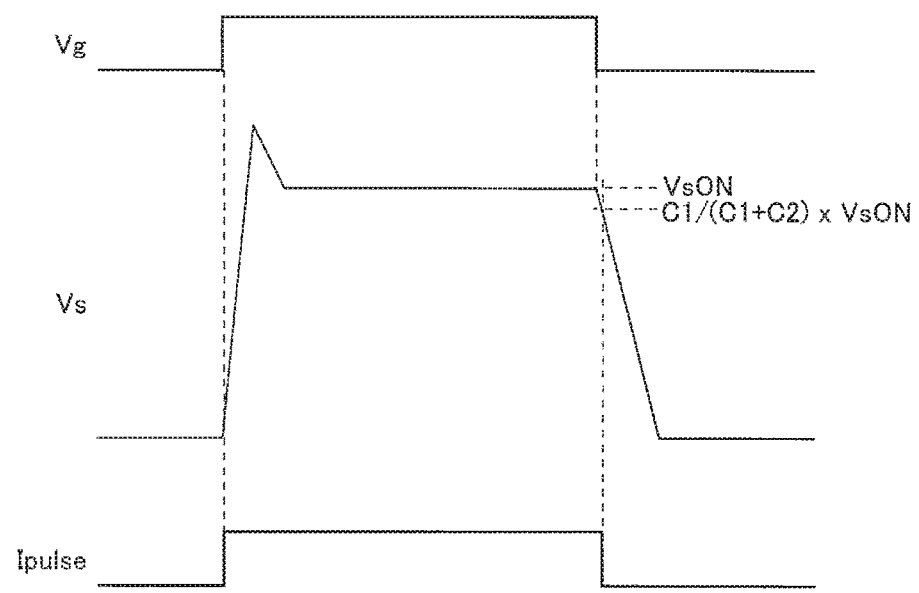
FIG. 2 is an explanatory view of the operation of a timing detection circuit.

FIG. 1 illustrates a power conversion apparatus according to a first embodiment and FIG. 2 is an explanatory view of the operation of a timing detection circuit.

The power conversion apparatus includes a power conversion apparatus controller 11 and a switching operation section 12, which constitute a so-called IPM (Intelligent Power Module). The switching operation section 12 is constituted by connecting a plurality of power semiconductor elements in parallel in order to increase the current capacity. In the illustrated example, the power semiconductor element includes a plurality of IGBTs 13a to 13n, and each of recirculation diodes 14a to 14n is connected in antiparallel to each of the IGBTs 13a to 13n. Moreover, each of sense resistors Rsa to Rsn is connected to each of current sensing terminals of the IGBTs 13a to 13n. Note that, here, the reference numerals "13a to 13n" indicate that there is a plurality of objects "13a, 13b, 13c, . . . ".

In the illustration, the power conversion apparatus controller 11 is configured so as to control the IGBT 13a, but the other IGBTs are controlled by power conversion apparatus controllers having the same configuration, though the illustration thereof is omitted.

The power conversion apparatus controller 11 includes a gate drive circuit 15 configured to receive a gate signal Vg, and the output of the gate drive circuit 15 is connected to the gate of the IGBT 13a. The power conversion apparatus controller 11 also includes a sample and hold circuit 16 and a comparator 17, which constitute the timing detection circuit for detecting the turn-on and turn-off times of the IGBT 13a.

The sample and hold circuit 16 includes voltage buffer circuits 18 and 19, a switch SW, and capacitors C1 and C2. The voltage buffer circuit 18 has an input connected to a connection point between the current sensing terminal of the IGBT 13a and the sense resistor Rsa, and has an output connected to the noninverting input of the comparator 17 and to one of the terminals of the switch SW. The other terminal of the switch SW is connected to a voltage dividing circuit 20 constituted by connecting the capacitors C1 and C2 in series, and the common connection point of the capacitors C1 and C2 is connected to the input of the voltage buffer circuit 19. The output of the voltage buffer circuit 19 is connected to the inverting input of the comparator 17.

The voltage buffer circuits 18 and 19 each may be configured by a voltage follower. Moreover, the switch SW may be, for example, an analog switch constituted by a transfer gate, and is turned on or off in synchronization with the gate signal Vg for turning on or off. That is, when the gate signal Vg is at an off level, the terminals of the switch SW are disconnected, while when the gate signal Vg is at an on level, the switch SW becomes in a conduction state and the sense voltage Vs sent from the voltage buffer circuit 18 is sent to the voltage dividing circuit 20.

According to the power conversion apparatus having the above configuration, as illustrated in FIG. 2, when the gate signal Vg is at an L (low) level, the output of the gate drive circuit 15 also becomes an L level and the IGBT 13a is turned off. Thus, the sense current Is will not flow, and therefore the sense voltage Vs which is the terminal voltage of the sense resistor Rs becomes an L level. At this time, at least the charge, which was charged into the capacitors C1 and C2 of the voltage dividing circuit 20 when the previous gate signal Vg was at an H (high) level, remains and therefore the signal Ipulse of the output of the comparator 17 becomes an L level.

Here, when the gate signal Vg becomes an H level, the switch SW is turned on and the sample and hold circuit 16 becomes in a sample mode and a charge corresponding to the sense voltage Vs will be charged into the capacitors C1 and C2. Moreover, when the gate signal Vg becomes an H level, the output of the gate drive circuit 15 also becomes an H level and the IGBT 13a will transition to a turn-on state. Accordingly, the sense current Is increases and the sense voltage Vs also increases.

This sense voltage Vs is directly input to the noninverting input of the comparator 17 and also supplied to the capacitors C1 and C2 of the voltage dividing circuit 20 through the switch SW. In the voltage dividing circuit 20, because the capacitors C1 and C2 are connected in series, the voltage of $C1/(C1+C2) \times Vs$ is output to the common connection point of the capacitors C1 and C2, and is input to the inverting input of the comparator 17 via the voltage buffer circuit 19. Here, when the values of the capacitors C1 and C2 are set to satisfy $C1=9 \times C2$, for example, the output of the voltage dividing circuit 20 becomes $0.9 \times Vs$.

Because the voltage input to the inverting input of the comparator 17 is always lower than the sense voltage Vs input to the noninverting input of the comparator 17, the signal Ipulse of the output of the comparator 17 becomes an H level. That is, the turn-on time of the IGBT 13a will be detected at an early stage while the IGBT 13a is transitioning to a turn-on state.

When the IGBT 13a is turned on, the sense voltage Vs becomes a voltage VsON during turn-on, the voltage of the common connection point of the capacitors C1 and C2 becomes $C1/(C1+C2) \times VsON$ and the signal Ipulse of the output of the comparator 17 becomes an H level.

Next, when the gate signal Vg becomes an L level, the switch SW is turned off, the path between the voltage buffer circuit 18 and the voltage dividing circuit 20 is shut off and the sample and hold circuit 16 holds the voltage VsON. Thus, the decreasing sense voltage Vs is input to the noninverting input of the comparator 17, and the fixed voltage $C1/(C1+C2) \times VsON$ is input to the inverting input as the reference voltage. As described above, the reference voltage of the comparator 17 is generated from the voltage VsON that is based on the sense current Is immediately before the IGBT 13a is turned off, but not based on a voltage near the ground level at which the tail current flows. Therefore, the comparator 17 is capable of detecting a change in the sense current Is immediately after the IGBT 13a is turned off, and is thus capable of quickly detecting the turn-off time of the IGBT 13a. In addition, the voltage $C1/(C1+C2) \times VsON$ is dynamically varied based on the voltage VsON during turn-on, and therefore the turn-off time of the IGBT 13a may be detected immediately after turn-off, independently of the value of the current during turn-on.

In this power conversion apparatus, because the time when the current of the IGBT 13a starts to stop may be detected, the turn-off time may be detected without an error. In addition, the current of the IGBT 13a is compared with a reference voltage which is generated based on the sense voltage VsON when the IGBT 13a is newly turned on, the sense voltage VsON having been held for each switching after the current of the IGBT 13a reliably stopped, and therefore a difference between the sense voltage VsON and the reference voltage may be set to a predetermined ratio without depending on the output current. Therefore, the correction for aligning the turn-on and turn-off times of the IGBTs 13a to 13n connected in parallel may be easily made by an upper control circuit.

Figure 3:
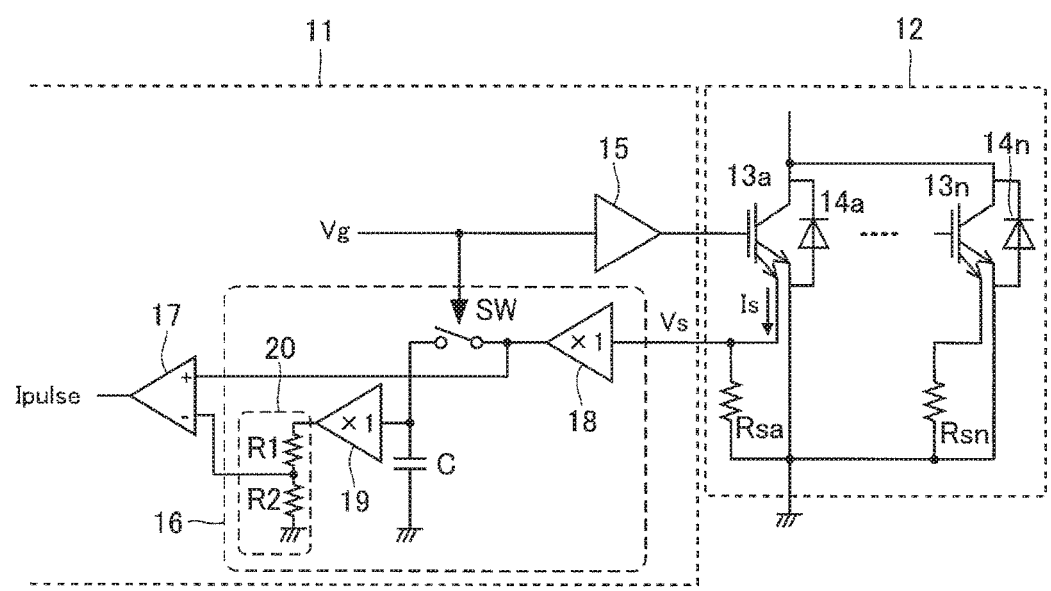
FIG. 3 illustrates a power conversion apparatus according to a second embodiment.

FIG. 3 illustrates a power conversion apparatus according to a second embodiment. In this FIG. 3, a component same as or equal to the component illustrated in FIG. 1 is given the same reference sign and the detailed description thereof will be omitted.

In the power conversion apparatus according to the second embodiment, the configuration of the sample and hold circuit 16 is modified as compared with the power conversion apparatus according to the first embodiment. That is, in the first embodiment, the circuit for holding the sense voltage Vs and the voltage dividing circuit 20 are constituted by the capacitors C1 and C2. In contrast, in the second embodiment, the circuit for holding the sense voltage Vs is constituted by a capacitor C and the voltage dividing circuit 20 is constituted by resistors R1 and R2 connected in series. In the voltage dividing circuit 20, the voltage R2/(R1+R2)×Vs is output to the common connection point of the resistors R1 and R2, and is input to the inverting input of the comparator 17 as the reference voltage.

The operation of the power conversion apparatus according to the second embodiment is the same as the operation of the power conversion apparatus according to the first embodiment. That is, the sense voltage Vs corresponding to a current level immediately before the IGBT 13a is turned off is held in the sample and hold circuit 16 for each switching, and a voltage obtained by dividing the held sense voltage Vs is used as the reference voltage of the comparator 17. In the comparator, the reference voltage is compared with the sense voltage Vs corresponding to the present current level during transition to a turn-off state, and if the sense voltage Vs falls below the reference voltage, then it is recognized that the current of the IGBT 13a has fallen, and the turn-off time of the IGBT 13a is detected.

Figure 4:
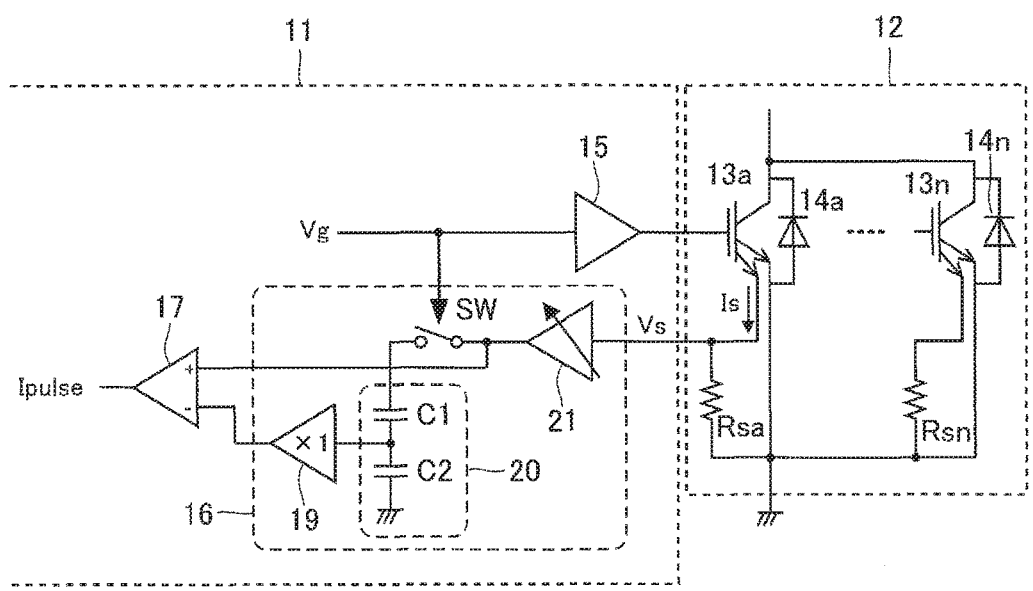
FIG. 4 illustrates a power conversion apparatus according to a third embodiment.
Figure 5:
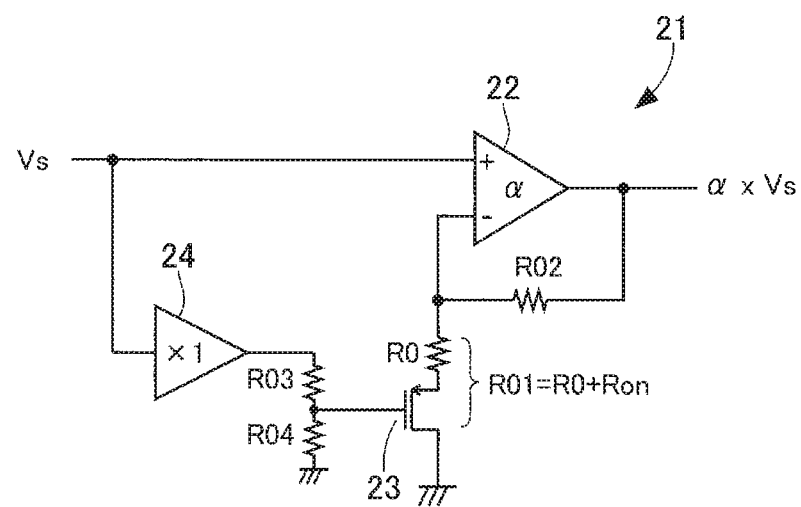
FIG. 5 illustrates a configuration example of a variable gain amplifier in a sample and hold circuit.

FIG. 4 illustrates a power conversion apparatus according to a third embodiment and FIG. 5 illustrates a configuration example of a variable gain amplifier in a sample and hold circuit. In this FIG. 4, a component same as or equal to the component illustrated in FIG. 1 is given the same reference sign and the detailed description thereof will be omitted.

In the power conversion apparatus according to the third embodiment, the voltage buffer circuit 18 of the first and second embodiments is replaced with a variable gain amplifier 21. This is a countermeasure against the fact that when the collector current during turn-on is high enough, the turn-off time may be relatively accurately detected, while when the collector current during turn-on is low, the turn-off time is not accurately detected. Then, in the third embodiment, when the potential of the sense voltage Vs is low, an amplification factor α of the variable gain amplifier 21 is variably amplified in accordance with the sense voltage Vs, thereby outputting a predetermined voltage signal independently of the collector current during turn-on.

The variable gain amplifier 21 includes a noninverting amplifier configured by an operational amplifier 22 as illustrated in FIG. 5. The operational amplifier 22 has the noninverting input for receiving the sense voltage Vs and has the inverting input connected to a series circuit of a resistor R0 and a MOSFET (Metal-Oxide-Semiconductor Field-Effect Transistor) 23, and a resistor R02 is connected between the inverting input and the output. The variable gain amplifier 21 also includes a voltage buffer circuit 24 configured to receive the sense voltage Vs, the output of this voltage buffer circuit 24 is connected to a voltage dividing circuit formed by resistors R03 and R04, and the common connection point of the resistors R03 and R04 is connected to the gate of the MOSFET 23.

In the operational amplifier 22, the amplification factor α is determined by a ratio between a variable resistor R01, which is obtained by combining the resistor R0 and the on-resistance Ron of the MOSFET 23, and the resistor R02 for feedback. Here, while the MOSFET 23 is turned off, the operational amplifier 22 functions as a voltage follower with the amplification factor α=1. While the MOSFET 23 is turned on, the amplification factor α of the operational amplifier 22 varies between α= maximum value when the on-resistance Ron of the MOSFET 23 is the smallest and α=1 when the MOSFET 23 is turned off.

The MOSFET 23 is turned off when the potential of the sense voltage Vs varies, for example, from the maximum to an approximately intermediate value and the sense voltage Vs corresponding thereto is applied to the gate of the MOSFET 23. Moreover, when the potential of the sense voltage Vs falls, for example, below its intermediate potential, the amplification factor α of the MOSFET 23 varies in accordance with its on-resistance Ron. That is, the amplification factor α varies between 1+R02/R01 and 1. Note that, the point where the amplification factor α transitions between 1+R02/R01 and 1 is set by a division ratio determined by the resistors R03 and R04.

Thus, i.e., by appropriately setting the values of the resistors R01, R02, R03, and R04, in the sample and hold circuit 16, in the region where the potential of the sense voltage Vs is low, the amplification factor α of the variable gain amplifier 21 is made variable in accordance with the sense voltage Vs, so that the output of the variable gain amplifier 21 becomes constant independently of the sense voltage Vs. Because even when the potential of the sense voltage Vs is low, the turn-off time may be detected with the accuracy when the potential of the sense voltage Vs is high, the turn-off time as a whole may be accurately detected.

Note that, in this embodiment, the variable gain amplifier 21 is provided on the input side of the sample and hold circuit 16, but the similar effect may be obtained even if the variable gain amplifier 21 is provided on the output side of the sample and hold circuit 16. Moreover, in this embodiment, the method for making the amplification factor α of the variable gain amplifier 21 variable employs a configuration in which the value of the variable resistor R01 between the inverting input of the operational amplifier 22 and the ground is made variable, but it is the matter of course that the resistor R02 for feedback may be made variable.

Figure 6:
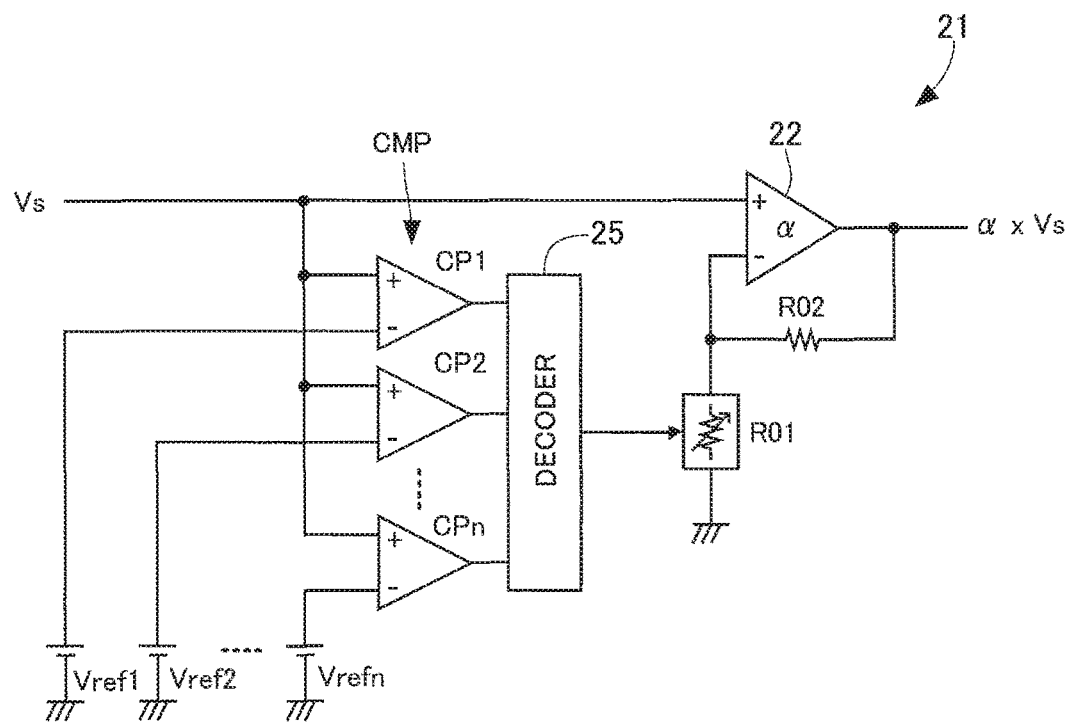
FIG. 6 illustrates a configuration example of the variable gain amplifier in a sample and hold circuit of a power conversion apparatus according to a fourth embodiment.

FIG. 6 illustrates a configuration example of the variable gain amplifier in a sample and hold circuit of a power conversion apparatus according to a fourth embodiment. In this FIG. 6, a component same as or equal to the component illustrated in FIG. 5 is given the same reference sign and the detailed description thereof will be omitted.

In the fourth embodiment, the variable gain amplifier 21 of the sample and hold circuit 16 is realized by a digital approach. That is, the variable gain amplifier 21 includes the operational amplifier 22, the variable resistor R01 and the resistor R02, a comparator array CMP constituted by a plurality of comparators CP1 to CPn, a plurality of reference voltage sources Vref1 to Vrefn, and a decoder 25.

In the comparators CP1 to CPn constituting the comparator array CMP, the sense voltage Vs is input to the noninverting input and the reference voltage sources Vref1 to Vrefn are input to the inverting inputs, respectively. Here, assume that the reference voltage sources Vref1 to Vrefn have a relationship of Vref1<Vref2<...<Vrefn. The outputs of the comparator array CMP are input to the decoder 25, and the output of the decoder 25 is connected to a control terminal of the variable resistor R01.

The comparator array CMP outputs a digital code of 0 or 1 as the sense voltage Vs varies. Because the digital code output here is a thermometer code, the thermometer code is input to the decoder 25 and converted into a binary code.

Here, as a specific configuration example, a case will be described where the number of comparators CP1 to CPn is eight (n=8). In this case, this decoder 25 has eight inputs and three outputs. Moreover, the variable resistor R01 has a configuration, for example, in which a plurality of resistors is connected in series and a semiconductor switch, which is turned on or off by the output of the decoder 25, is connected in parallel to each of the plurality of resistors connected in series. In this configuration, when the sense voltage Vs is between 0 and Vref1, the comparators CP1 to CP8 output (00000000), while when the sense voltage Vs exceeds Vref8, the comparators CP1 to CP8 output (11111111). Upon receipt of a thermometer code input which varies from (00000000) to (11111111), the decoder 25 outputs a 3-bit binary code which varies from (000) to (111). In the variable resistor R01, when the binary code output from the decoder 25 is (0), the corresponding semiconductor switch is turned on, while when the binary code is (1), the corresponding semiconductor switch is turned off.

Accordingly, when the sense voltage Vs is 0 to Vref1, the decoder 25 receives the input of (00000000) and outputs (000). Thus, three resistors connected in series among the plurality of resistors are shorted by the corresponding semiconductor switches, respectively, so that the variable resistor R01 has the minimum value, and the amplification factor α of the operational amplifier 22 becomes the maximum value. On the contrary, when the sense voltage Vs exceeds Vref8, the decoder 25 receives the input of (11111111) and outputs (111). Thus, three resistors connected in series among the plurality of resistors are all opened by the corresponding semiconductor switches, respectively, so that the variable resistor R01 has the maximum value, and the amplification factor α of the operational amplifier 22 becomes the minimum value. Thus, the output of the operational amplifier 22 falls within a predetermined voltage range even if the sense voltage Vs varies, i.e., even if the collector current during turn-on of the IGBT 13a varies with a load. As the result, a voltage needed for comparison with a sufficient accuracy will be always applied to the comparator 17.

Note that, the variable gain amplifier 21 has been described, with a case, taken as an example, where eight comparators CP1 to CP8 are used to have a 3-bit resolution, but the decoder 25 may be configured to have a larger number of bits when the resolution is desired to be increased. Moreover, although in this embodiment, the method for making the amplification factor α of the variable gain amplifier 21 variable employs a configuration in which the value of the variable resistor R01 between the inverting input of the operational amplifier 22 and the ground is made variable, but the resistor R02 for feedback may be made variable. Furthermore, when the sense voltage Vs detects 0 to Vref1, the reference voltage source Vref1 may be set to have a high value to a level where there is no problem even if the collector current decreases and the current balance is lost.

Figure 7:
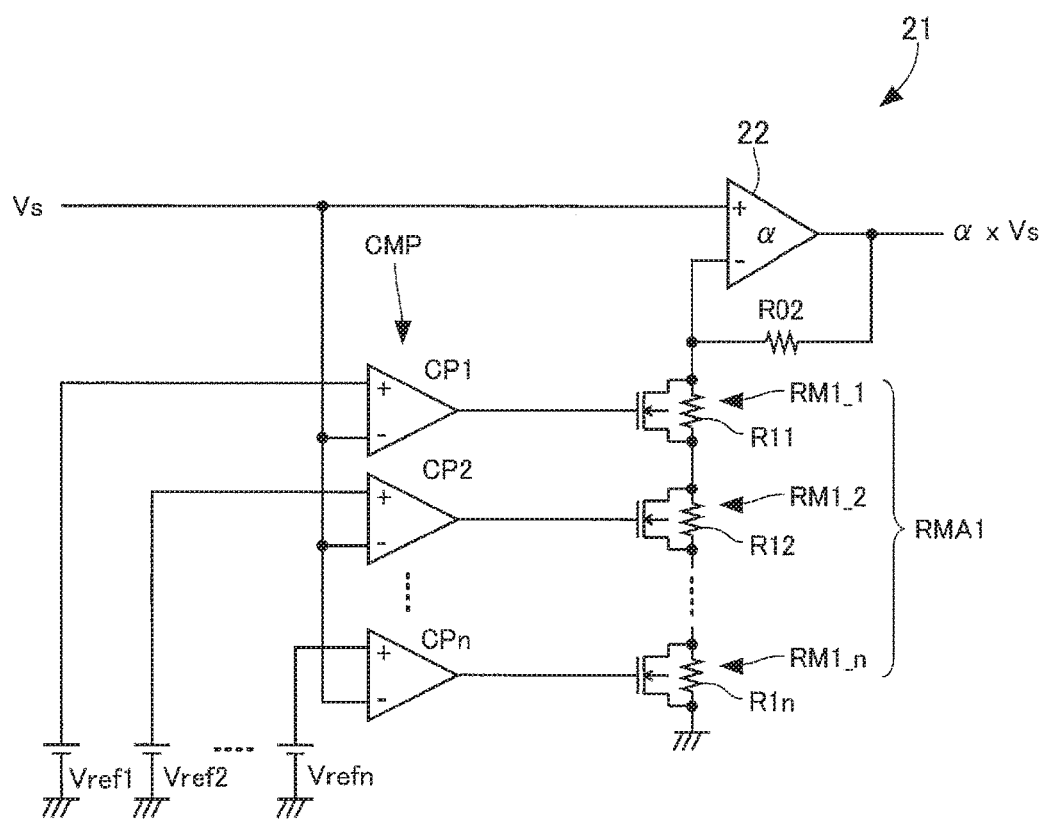
FIG. 7 illustrates a configuration example of the variable gain amplifier in a sample and hold circuit of a power conversion apparatus according to a fifth embodiment.

FIG. 7 illustrates a configuration example of the variable gain amplifier in a sample and hold circuit of a power conversion apparatus according to a fifth embodiment. In this FIG. 7, a component same as or equal to the component illustrated in FIG. 5 or FIG. 6 is given the same reference sign and the detailed description thereof will be omitted.

The fifth embodiment is a method different from the fourth embodiment, i.e., is a method for controlling the amplification factor of the operational amplifier 22 by directly inputting a thermometer code output by the comparator array CMP to the variable resistance section. Here, the variable gain amplifier 21 of the sample and hold circuit 16 is realized by a digital approach. That is, the variable gain amplifier 21 includes the operational amplifier 22, a first-type resistor module array RMA1 and the resistor R02, the comparator array CMP constituted by a plurality of comparators CP1 to CPn, and a plurality of reference voltage sources Vref1 to Vrefn. The first-type resistor module array RMA1 includes a first-type resistor module RM1_1, a first-type resistor module RM1_2, . . . , and a first-type resistor module RM1_n connected in series.

Each of the first-type resistor modules is formed by connecting a resistor between the source and drain of a MOSFET. The resistors each connected between the source and drain of the MOSFET are denoted as a resistor R11, a resistor R12, . . . , and a resistor R1n corresponding to the first-type resistor module RM1_1, the first-type resistor module RM1_2, . . . , and the first-type resistor module RM1_n, respectively. The first-type resistor module array RMA1 is configured such that the source electrodes of the first-type resistor module RM1_1, the first-type resistor module RM1_2, . . . , and the first-type resistor module RM1_n−1 are connected to the drain electrodes of the other first-type resistor modules, respectively.

The drain electrode of the first-type resistor module RM1_1 is connected to the inverting input of the operational amplifier 22, and the source electrode of the first-type resistor module RM1_n is connected to the ground. The outputs of the comparators CP1 to CPn constituting the comparator array CMP are connected to the gate electrodes of the first-type resistor module RM1_1, the first-type resistor module RM1_2, . . . , and the first-type resistor module RM1_n, respectively.

In the embodiment, with regard to the inputs of the comparators CP1 to CPn, the reference voltages Vref1, Vref2, . . . , and Vrefn are input to the noninverting input terminals of the corresponding comparators CP1 to CPn, respectively. The sense voltage Vs is input to the inverting input terminal of each of the comparators CP1 to CPn.

It may be configured such that when each output of the comparators CP1 to CPn becomes "1" (high level), the corresponding first-type resistor module is switched on. With regard to the resistor R11, the resistor R12, . . . , and the resistor R1n, each resistance value thereof may be set to any value, but each resistance value may be set to an identical value, e.g., RR. The reference voltage sources Vref1 to Vrefn may have a relationship of Vref1<Vref2< . . . <Vrefn.

In the variable gain amplifier 21 configured in this manner, in response to each output of the comparators CP1 to CPn, the corresponding first-type resistor module is switched off, and therefore as the sense voltage Vs transitions from a low state to a high state, the first-type resistor modules will be sequentially switched off, and the resistance value corresponding to the first-type resistor module array RMA1 will increase to RR, 2RR, . . . and so on. That is, the first-type resistor module array RMA1 has a function similar to the variable resistor R01 in the fourth embodiment. Therefore, the fifth embodiment has an effect similar to the fourth embodiment.

In the foregoing, the fifth embodiment has been theoretically described, but practically, in order to prevent the noninverting input terminal of the operational amplifier 22 from being grounded by closing of all the MOSFET switches of the first-type resistor module array RMA1, it may be configured such that a resistor having a resistance value RR, for example, is inserted between the drain electrode of the first-type resistor module RM1 and the feedback resistor R02, and the value of the resistor Rn connected to the MOSFET opened or closed by the comparator CPn corresponding to the reference voltage Vrefn has a value sufficiently larger than the resistance value of the resistor R02.

Figure 8:
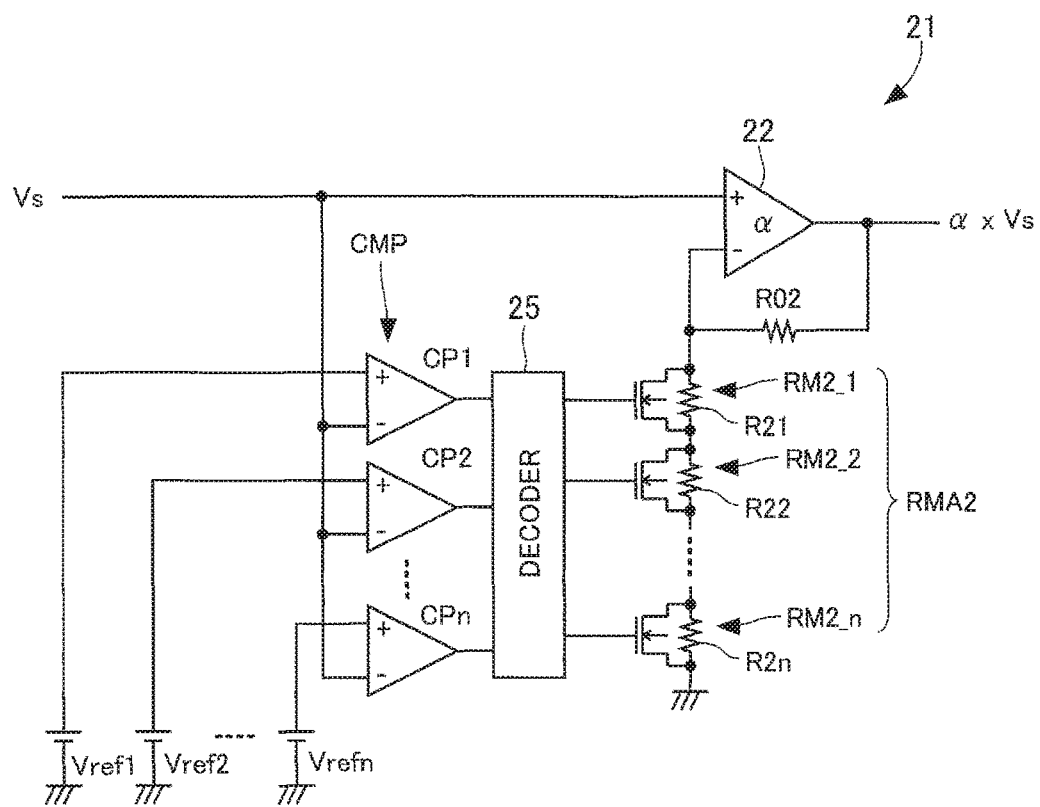
FIG. 8 illustrates a configuration example of the variable gain amplifier in a sample and hold circuit of the power conversion apparatus according to a sixth embodiment.
Figure 9:
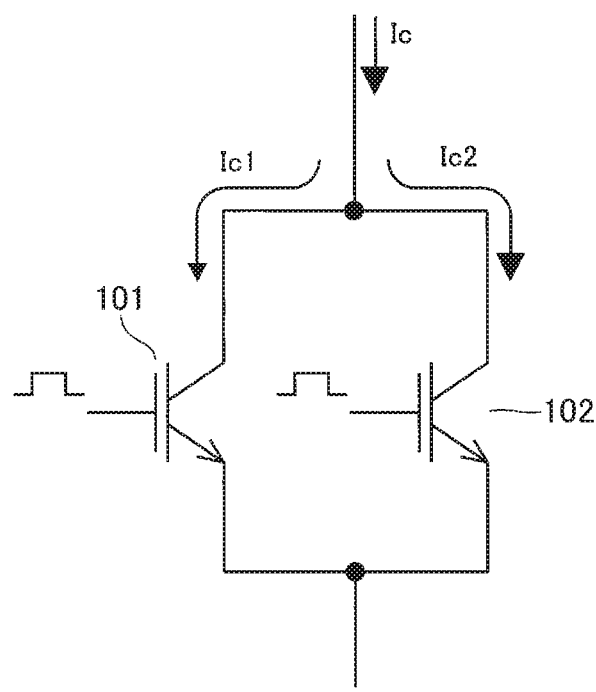
FIG. 9 illustrates a switching circuit formed by connecting two power semiconductor elements in parallel.
Figure 10:
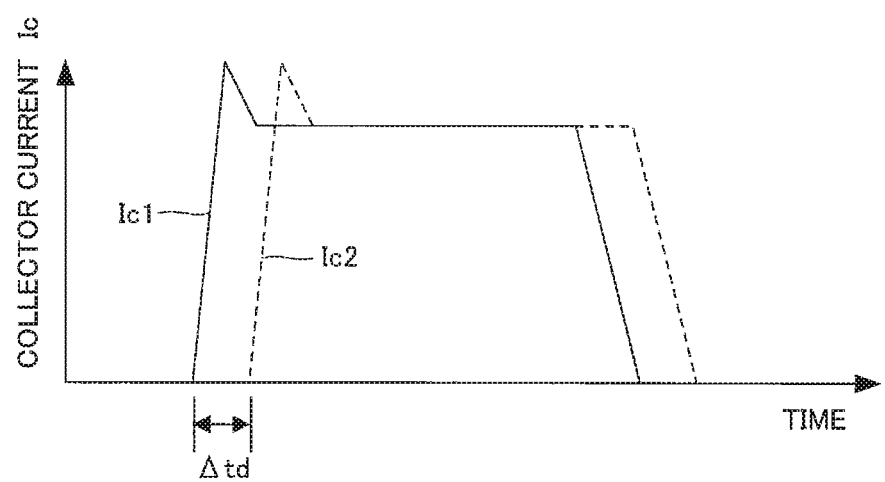
FIG. 10 illustrates the current changes when two power semiconductors are switched.
Figure 11:
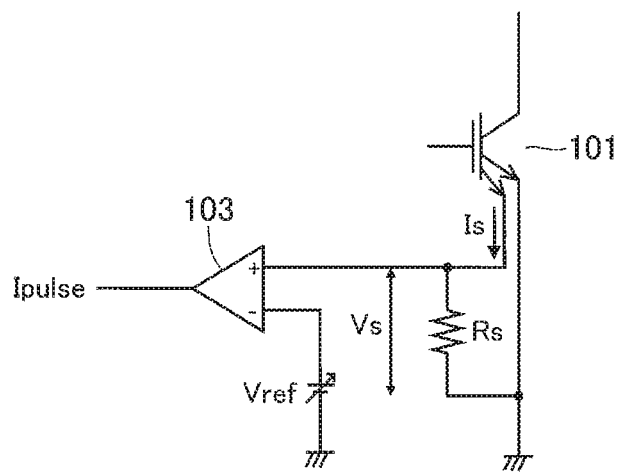
FIG. 11 illustrates an example of a timing detection circuit.
Figure 12:
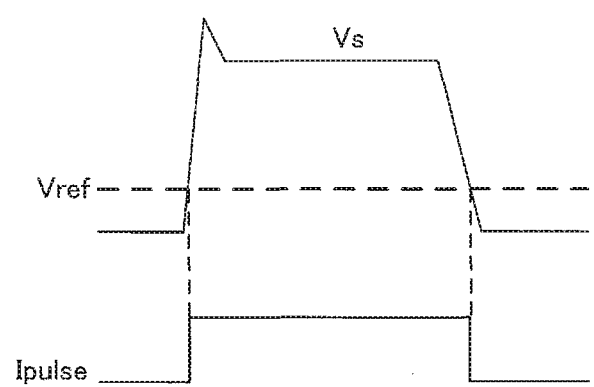
FIG. 12 is an explanatory view of the operation of the timing detection circuit.
Figure 13:
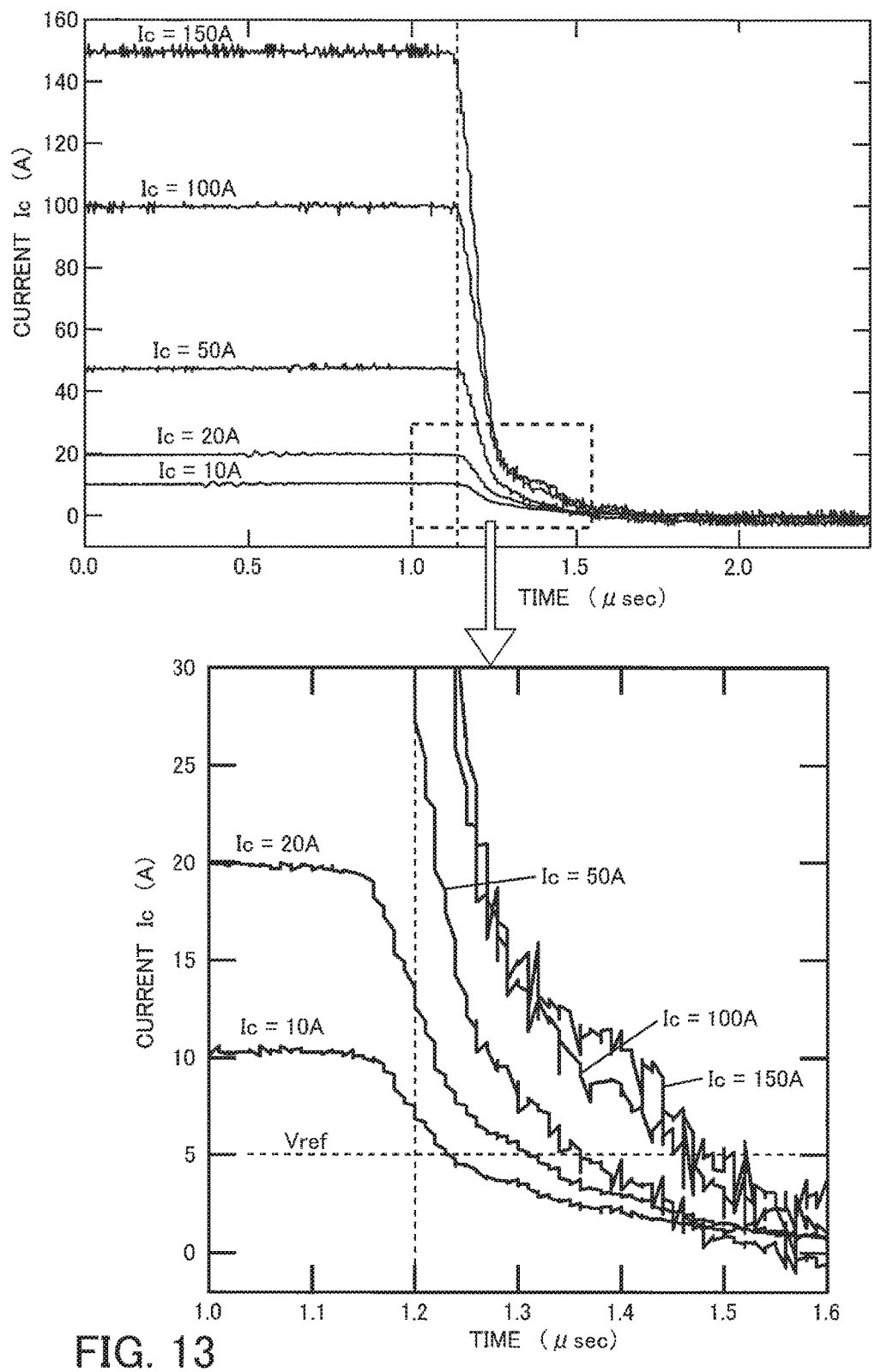
FIG. 13 illustrates a tail current that flows after turn off of an IGBT.

FIG. 8 illustrates a configuration example of the variable gain amplifier in a sample and hold circuit of a power conversion apparatus according to a sixth embodiment. In this FIG. 8, a component same as or equal to the component illustrated in FIG. 5 or FIG. 6 is given the same reference sign and the detailed description thereof will be omitted.

The sixth embodiment is a method different from the fourth embodiment. Here, the variable gain amplifier of the sample and hold circuit 16 is realized by a digital approach. That is, the variable gain amplifier 21 includes the operational amplifier 22, a second-type resistor module array RMA2 and the resistor R02, the comparator array CMP constituted by a plurality of comparators CP1 to CPn, a plurality of reference voltage sources Vref1 to Vrefn, and the decoder 25.

The second-type resistor module array RMA2 includes second-type resistor modules RM2_1, RM2_2, ..., and RM2_n connected in series.

Each second-type resistor module is formed by connecting a resistor between the source and drain of a MOSFET. The resistors each connected between the source and drain of the MOSFET are denoted as resistors R21, R22, ..., and R2n corresponding to the second-type resistor modules RM2_1, RM2_2, ..., and RM2_n, respectively. In the second-type resistor module array RMA2, the source electrodes of the second-type resistor modules RM2_1, RM2_2, ..., and RM2_n−1 are connected to the drain electrodes of the other second-type resistor module, respectively.

The drain electrode of the second-type resistor module RM2_1 is connected to the inverting input of the operational amplifier 22, and the source electrode of the second-type resistor module RM2_n is connected to the ground. The outputs of the comparators CP1 to CPn constituting the comparator array CMP are connected to the gate electrodes of the second-type resistor modules RM2_1, RM2_2, ..., and RM2_n, respectively.

In the embodiment, with regard to each input of the comparators CP1 to CPn, the reference voltages Vref1, Vref2, ..., and Vrefn are input to the noninverting input terminals of the corresponding comparators CP1 to CPn, respectively. The sense voltage Vs is input to the inverting input terminal of each of the comparators CP1 to CPn.

With regard to the resistors R21, R22, ..., and R2n, each resistance value may be set to any value, but may be set to a binary-weighted value. That is, for example, in FIG. 8, if the value of the resistor RM2n of the second-type resistor module RM2_n is set to RR, the value of the resistor R22 of the second-type resistor module RM2_2 may be set to $2^{(n-1)} \times RR$ and the value of the resistor R21 of the second-type resistor module RM2_1 may be set to $2^n \times RR$. The reference voltage sources Vref1 to Vrefn may have a relationship of Vref1<Vref2< ... <Vrefn.

The sixth embodiment may be a method, in which a thermometer code output by the comparator array CMP of the fifth embodiment is decoded by a decoder to a binary code and input to the variable resistance section to control the amplification factor of the operational amplifier 22. The outputs of the comparators CP1 to CPn are input to the decoder 25, and the outputs of the decoder 25 are connected to the second-type resistor modules RM2_1, RM2_2, ..., and RM2_n, respectively. The thermometer code input to the decoder 25 is converted into a binary code (e.g., an 8-bit thermometer code is converted into a 3-bit binary code) to make each second-type resistor module operate.

That is, the second-type resistor module array RMA2 has a function similar to the variable resistor R01 in the fourth embodiment. Therefore, the sixth embodiment has an effect similar to the fourth embodiment.

Moreover, also in the embodiment, as with the theoretical description about the fifth embodiment, practically a countermeasure may be taken for preventing the noninverting input terminal of the operational amplifier 22 from being grounded by closing of all the MOSFET switches of the second-type resistor module array RMA2.

For the fifth embodiment and sixth embodiment, when the circuitry is integrated, there are fewer signal lines in the sixth embodiment than in the fifth embodiment, and therefore the chip area may be reduced in the sixth embodiment. On the other hand, a decode circuit is added in the sixth embodiment. Therefore, the fifth embodiment and sixth embodiment may be selectively used, such as when the number of the reference voltage sources Vref1 to Vrefn is large, the sixth embodiment is employed, while when the number of the reference voltage sources Vref1 to Vrefn is small, the fifth embodiment is employed.

Note that, in the above-described embodiments, an IGBT has been described as each of a plurality of power semiconductor elements connected in parallel, but the embodiments discussed herein may be applicable to a power MOSFET which does not produce the tail current.

The above-described control device for power conversion apparatus and power conversion apparatus are capable of detecting the turn-off time of a power semiconductor element at the time when the current of the power semiconductor element starts to stop, and therefore have an advantage that the turn-off time may be accurately detected regardless of the magnitude of the main current of the power semiconductor element.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A control device for a power conversion apparatus, the control device comprising:
    gate drive circuits configured to simultaneously turn on or off a plurality of power semiconductor elements connected in parallel, respectively;
    timing detection comparators each configured to compare a sense voltage detected as a voltage proportional to a main current that flows when a corresponding one of the plurality of power semiconductor elements is turned on, with a reference voltage to detect turn-on and turn-off times of the corresponding power semiconductor element; and
    sample and hold circuits each configured to hold the sense voltage when the power semiconductor element is turned on, divide the sense voltage being held when the corresponding power semiconductor element is turned off, and supply a resulting divided voltage as the reference voltage for detecting the turn-off times of the corresponding power semiconductor element to a corresponding one of the timing detection comparators.

2. The control device for a power conversion apparatus according to claim 1, wherein each of the sample and hold circuits includes:
    a first voltage buffer circuit configured to receive the sense voltage;
    a switch having one terminal connected to an output of the first voltage buffer circuit and being configured to be conductive when the corresponding power semiconductor element is turned on and to be cut off when the corresponding power semiconductor element is turned off;
a capacitor connected to another terminal of the switch and configured to hold the sense voltage; and
a voltage dividing circuit configured to divide a voltage held in the capacitor.

3. The control device for a power conversion apparatus according to claim 2, wherein the voltage dividing circuit includes, as the capacitor, a first and a second capacitor connected in series, and is configured to supply, as the reference voltage, a divided voltage obtained by dividing the voltage by the first and second capacitors to the corresponding timing detection comparator via a second voltage buffer circuit.

4. The control device for a power conversion apparatus according to claim 2, wherein the voltage dividing circuit includes first and second resistors connected in series, the first and second resistors receiving a voltage of the capacitor via a second voltage buffer circuit, and is configured to supply a divided voltage obtained by dividing the voltage by the first and second resistors to the corresponding timing detection comparator as the reference voltage.

5. The control device for a power conversion apparatus according to claim 2, wherein the switch is controlled by an input signal to the gate driver circuit, such that the switch is configured to be turned on or off in synchronization with a gate signal supplied to a corresponding one of the gate drive circuits.

6. The control device for a power conversion apparatus according to claim 1, wherein each of the sample and hold circuits includes:
a variable gain amplifier circuit configured to receive the sense voltage,
a switch having one terminal connected to an output of the variable gain amplifier circuit and being configured to be conductive when the corresponding power semiconductor element is turned on and to be cut off when the corresponding power semiconductor element is turned off;
a capacitor configured to hold the sense voltage, the capacitor being connected to another terminal of the switch; and
a voltage dividing circuit configured to divide a voltage held in the capacitor.

7. The control device for a power conversion apparatus according to claim 6, wherein the variable gain amplifier circuit includes:
a noninverting amplifier circuit;
a variable resistor for setting an amplification factor of the noninverting amplifier circuit; and
an amplification factor variable setting section which controls the variable resistor so that the amplification factor of the noninverting amplifier circuit becomes higher as the sense voltage becomes lower.

8. A power conversion apparatus comprising:
a plurality of power semiconductor elements connected in parallel; and
a control device for a power conversion apparatus, wherein the control device includes
gate drive circuits configured to simultaneously turn on or off the plurality of power semiconductor elements, respectively,
timing detection comparators each configured to compare a sense voltage detected as a voltage proportional to a main current, the main current flowing when a corresponding one of the plurality of power semiconductor elements is turned on, with a reference voltage to detect turn-on and turn-off times of the corresponding power semiconductor element; and
sample and hold circuits each configured to hold the sense voltage when the corresponding power semiconductor element is turned on, and to divide, when the corresponding power semiconductor element is turned off, the held sense voltage and supply a resulting divided voltage as the reference voltage for detecting the turn-off times of the corresponding power semiconductor element to the timing detection comparator.

9. A control device for a power conversion apparatus, comprising:
at least one gate drive circuit configured to turn on and off one of a plurality of power semiconductor switch elements connected in parallel with each other;
at least one timing detection comparator configured to compare a sense voltage corresponding to a current which flows when one of the plurality of power semiconductor switch elements is turned on with a reference voltage, and configured to output a timing signal corresponding to a turn on or turn off time of one of the plurality of power semiconductor switch elements; and
at least one sample and hold circuit configured to hold the sense voltage when one of the plurality of power semiconductor switch elements is turned on, configured to divide the sense voltage being held when one of the plurality of power semiconductor switch elements is turned off, and configured to supply a resulting divided voltage as the reference voltage to the at least one timing detection comparator.

10. The control device for a power conversion apparatus according to claim 9, wherein the at least one sample and hold circuit circuit comprises:
a first voltage buffer circuit configured to receive the sense voltage;
a voltage dividing circuit configured to divide a voltage output from the first voltage buffer circuit and to supply a divided voltage to the at least one timing detection comparator; and
a switch connected between the first voltage buffer and the voltage dividing circuit, the switch activated by an activation signal to the at least one gate drive circuit.

11. The control device for a power conversion apparatus according to claim 10, wherein the voltage dividing circuit comprises first and second capacitors connected in series,
the at least one sample and hold circuit further comprises a second voltage buffer circuit configured to receive a divided voltage from the first and second capacitors, and
the at least one timing detection comparator is configured to receive an output from the second voltage buffer circuit as the reference voltage.

12. The control device for a power conversion apparatus according to claim 10, wherein the voltage dividing circuit comprises:
a capacitor configured to hold the sense voltage; and
first and second resistors connected in series, the first and second resistors configured to receive a voltage of the capacitor and to supply a divided voltage obtained by dividing the voltage by the first and second resistors to the at least one timing detection comparator as the reference voltage.

13. The control device of claim 9, wherein the at least one sample and hold circuit comprises:

a variable gain amplifier circuit configured to receive the sense voltage;
a voltage dividing circuit configured to divide a voltage output from the variable gain amplifier circuit and to supply a divided voltage to the at least one timing detection comparator;
a switch connected between the variable gain amplifier and the voltage dividing circuit, the switch activated by an activation signal to the at least one gate drive circuit; and
a capacitor connected to a terminal of the switch, the capacitor configured to hold the sense voltage.

* * * * *